United States Patent
Chao et al.

(10) Patent No.: US 7,643,295 B2
(45) Date of Patent: Jan. 5, 2010

(54) HEAT-DISSIPATING MODULE HAVING A DUST REMOVING MECHANISM, AND ASSEMBLY OF AN ELECTRONIC DEVICE AND THE HEAT-DISSIPATING MODULE

(75) Inventors: Chien-Chih Chao, Taipei Hsien (TW); Kuei-Yung Cheng, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 12/172,745

(22) Filed: Jul. 14, 2008

(65) Prior Publication Data

US 2009/0180256 A1 Jul. 16, 2009

(30) Foreign Application Priority Data

Jan. 11, 2008 (TW) .............................. 97101156 A

(51) Int. Cl.
*H05K 7/20* (2006.01)
(52) U.S. Cl. ...................... 361/700; 361/695; 361/703; 361/704; 165/80.3; 165/104.33
(58) Field of Classification Search ........................ None
See application file for complete search history.

(56) References Cited

U.S. PATENT DOCUMENTS

| | | | |
|---|---|---|---|
| 6,980,434 B2 * | 12/2005 | Ou Yang et al. ............. | 361/695 |
| 7,158,378 B2 * | 1/2007 | Hinzpeter et al. ........... | 361/695 |
| 7,220,365 B2 * | 5/2007 | Qu et al. ..................... | 252/70 |
| 7,345,874 B2 * | 3/2008 | Cheng et al. ................ | 361/695 |
| 2007/0131383 A1 * | 6/2007 | Hattori et al. ............... | 165/11.2 |
| 2009/0016019 A1 * | 1/2009 | Bandholz et al. ............ | 361/695 |
| 2009/0021270 A1 * | 1/2009 | Bandholz et al. ............ | 324/690 |

\* cited by examiner

*Primary Examiner*—Boris L Chervinsky
(74) *Attorney, Agent, or Firm*—Stephen A. Bent; Foley & Lardner LLP

(57) ABSTRACT

In an assembly of an electronic device and a heat-dissipating module, the electronic device includes an electronic component disposed within a housing provided with an air outlet port, and the heat-dissipating module includes a heat-dissipating fin base disposed within the housing adjacent to the air outlet port, and a dust removing mechanism disposed on the heat-dissipating fin base. The heat-dissipating fin base includes two spaced-apart upright sidewalls, and a plurality of heat-dissipating fins arranged between the upright sidewalls. The dust removing mechanism includes a scraping plate disposed between the upright sidewalls and accessible outwardly of the air outlet port. The scraping plate has scraping teeth extending respectively into clearances among the heat-dissipating fins. By manipulating the scraping plate to displace upwardly and downwardly relative to the heat-dissipating fin base, dust that accumulates among the heat-dissipating fins can be scraped off.

23 Claims, 6 Drawing Sheets

HEAT-DISSIPATING MODULE HAVING A DUST REMOVING MECHANISM, AND ASSEMBLY OF AN ELECTRONIC DEVICE AND THE HEAT-DISSIPATING MODULE

CROSS-REFERENCE TO RELATED APPLICATION

This application claims priority of Taiwanese Application No. 097101156, filed on Jan. 11, 2008.

BACKGROUND OF THE INVENTION

1. Field of the Invention

The invention relates to a heat-dissipating module, more particularly to a heat-dissipating module with dust-removing functionality and to an assembly of an electronic device and the heat dissipating module.

2. Description of the Related Art

FIG. 1 shows a conventional heat-dissipating module 1 disclosed in U.S. Pat. No. 6,865,082, which includes a plurality of heat-dissipating fins 12 spaced apart from each other, a conducting heat pipe 11, and a conducting pad 10. The conducting heat pipe 11 has one end connected to the heat-dissipating fins 12, and another end connected to the conducting pad 10. The heat-dissipating module 1 is adapted to be disposed in a housing (not shown) of an electronic device, such as a notebook computer, such that the heat-dissipating fins 12 are proximate to an air outlet (not shown) of the housing, and such that the conducting pad 10 contacts a central processing unit (CPU) 15 in the notebook computer. Through the conducting pad 10 and the conducting heat pipe 11, heat generated by the central processing unit 15 during operation can be conducted to the heat-dissipating fins 12 so as to be dispelled through the air outlet of the housing by a fan (not shown), thereby achieving the effect of heat dissipation.

However, one problem commonly associated with the conventional heat-dissipating module 1 is that dust will accumulate in clearances among adjacent pairs of the heat-dissipating fins 12 after a period of use. However, since the heat-dissipating module 1 is mounted within the housing, it is relatively difficult for the user to clean the heat-dissipating module 1. With the passage of time, more dust will accumulate, and the clearances among the heat-dissipating fins 12 will be blocked, so that air currents generated by the fan cannot flow smoothly through the heat-dissipating fins 12 to carry away the heat, thereby affecting the overall heat-dissipating efficiency of the heat-dissipating module 1. In addition, the electronic device is liable to be damaged due to high heat or severe dust accumulation.

SUMMARY OF THE INVENTION

Therefore, an object of the present invention is to provide a heat-dissipating module capable of removing dust that accumulates among heat-dissipating fins, and an electronic device having the heat-dissipating module.

Accordingly, the heat-dissipating module having the dust removing mechanism of this invention includes a heat-dissipating fin base and a dust removing mechanism disposed on the heat-dissipating fin base.

The heat-dissipating fin base includes two spaced-apart upright sidewalls and a plurality of heat-dissipating fins arranged between the two upright sidewalls.

The dust removing mechanism includes a scraping plate disposed between the two upright sidewalls and movable relative to the heat-dissipating fins. The scraping plate has a force application portion adapted for application of a force, and a plurality of scraping teeth connected to the force application portion and extending respectively into clearances among the heat-dissipating fins. The force application portion is operable to bring the scraping teeth to displace relative to the heat-dissipating fins so as to scrape off dust that accumulates among the heat-dissipating fins.

In an assembly of the electronic device and the heat-dissipating module according to the present invention, the electronic device includes a housing and an electronic component disposed within the housing. The housing is provided with an air outlet port.

The heat-dissipating module is disposed within the housing, and includes a heat-dissipating fin base adjacent to the air outlet port, a dust removing mechanism disposed on the heat-dissipating fin base, a conducting heat pipe, and a conducting pad. The conducting heat pipe has one end connected to the heat-dissipating fin base, and another end connected to the conducting pad. The conducting pad contacts the electronic component.

According to a preferred embodiment of this invention, the heat-dissipating fin base further includes two guide rods disposed adjacent to the two upright sidewalls, respectively. The scraping plate includes two side plate portions, and first and second plate portions connected to the two side plate portions. The scraping plate is disposed between the two upright sidewalls such that the two guide rods extend respectively through the two side plate portions thereof, and is displaceable upwardly and downwardly relative to the two upright sidewalls. The scraping teeth are connected to the second plate portion. When the heat-dissipating module is disposed within the housing, the first plate portion has a part accessible outwardly of the housing to serve as the force application portion.

According to a preferred embodiment of the present invention, the two upright sidewalls have confronting inner sides each of which is recessed to form longitudinally extending first and second guide grooves. Each of the side plate portions is formed with first and second lugs extending respectively into the first and second guide grooves, whereby the side plate portions may be guided to displace upwardly and downwardly relative to the upright sidewalls.

In the present invention, with the provision of the dust removing mechanism, the heat-dissipating fin base may be constantly maintained in a clean and ventilated state, and will not become poorly ventilated after a period of use due to dust accumulation and blocking, which may affect heat dissipation. At the same time, possible damage to the electronic device due to poor heat dissipation or dust accumulation of the heat-dissipating module may be prevented.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
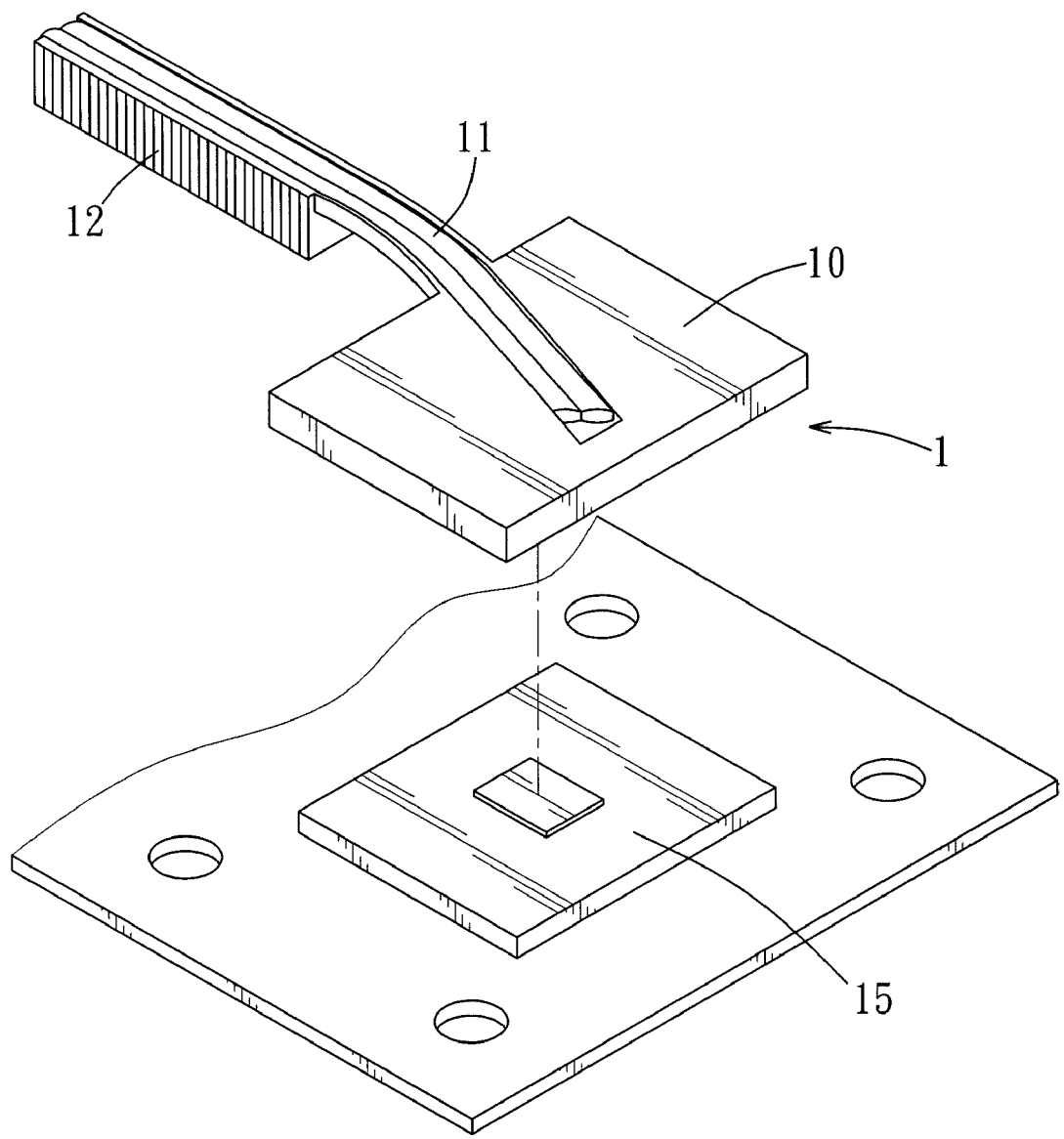
FIG. 1 illustrates, in part, a heat-dissipating module disclosed in U.S. Pat. No. 6,865,082.
Figure 2:
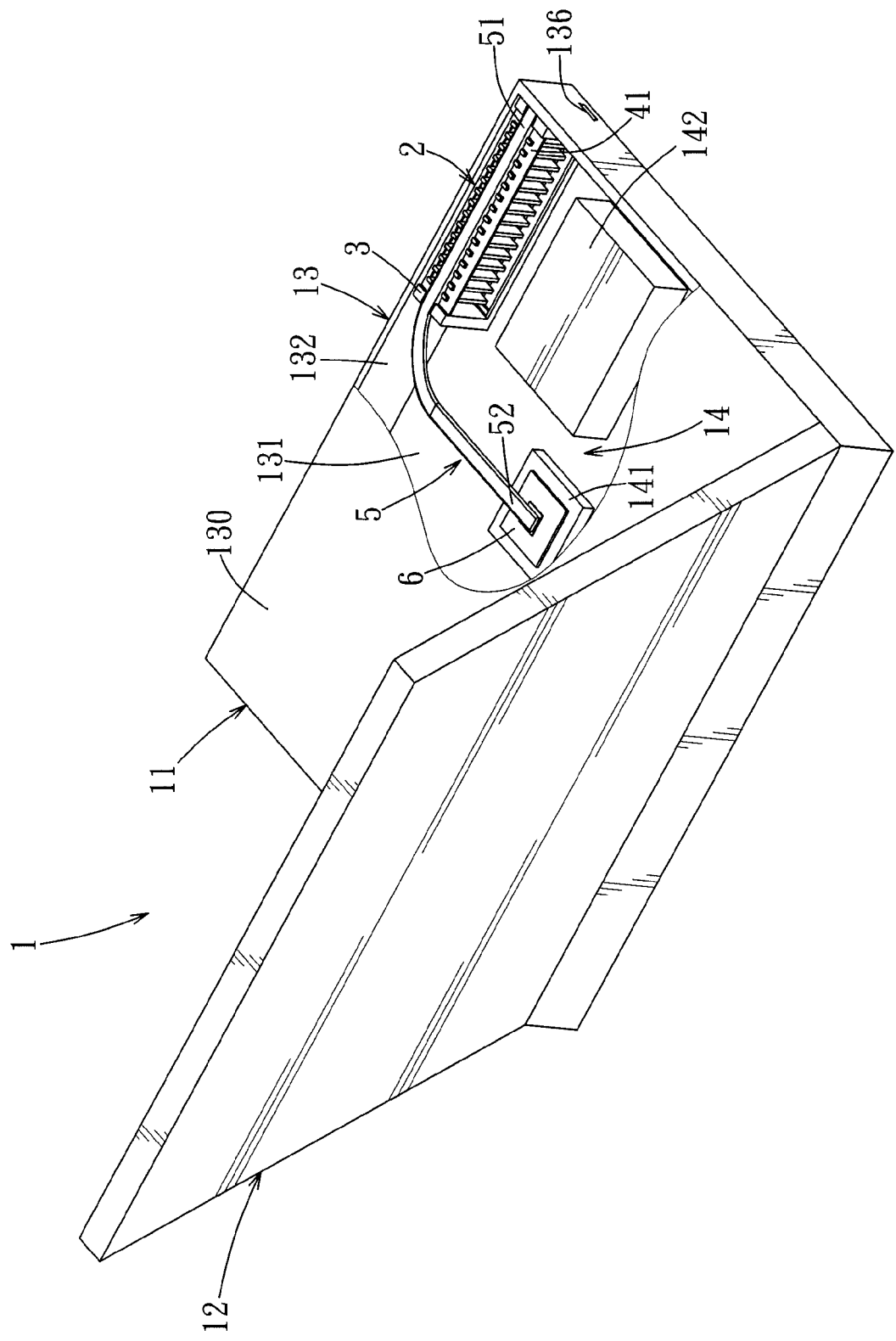
FIG. 2 is a perspective view of a preferred embodiment of an assembly of an electronic device and a heat-dissipating module according to the present invention.

Referring to FIG. 2, a preferred embodiment of an assembly of an electronic device and a heat-dissipating module according to the present invention is shown to include an electronic device 1 and a heat-dissipating module 2.

In this embodiment, the electronic device 1 is exemplified as a notebook computer. The electronic device 1 includes a device body 11 and a display 12 connected pivotally to the device body 11. The device body 11 includes a housing 13 and a plurality of electronic components 14 disposed within the housing 13. The electronic components 14 may include a central processing unit (CPU) 141, a hard disk (not shown), a motherboard (not shown), etc. A fan 142 is also mounted in the housing 13.

Figure 3:
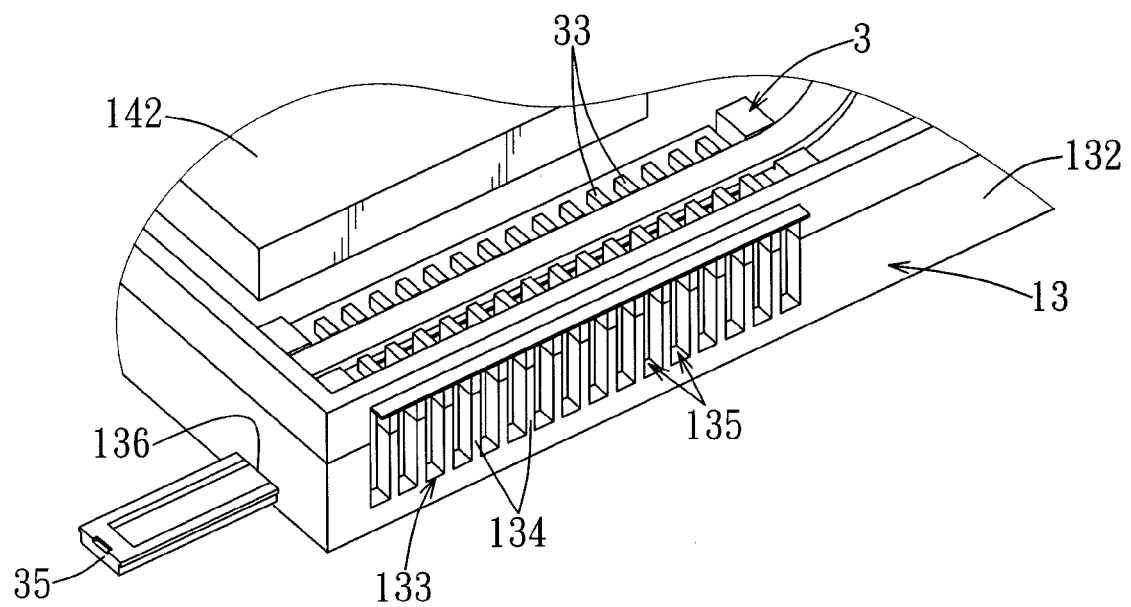
FIG. 3 is a fragmentary perspective view of the preferred embodiment viewed from another angle.

Referring to FIGS. 2 and 3, the housing 13 has spaced-apart top and bottom walls 130, 131, and a peripheral wall 132 connected to and interposed between the top and bottom walls 130, 131. The peripheral wall 132 is provided with an air outlet port 133 (which is located at a front edge of the housing 13 defined by the peripheral wall 132 in this embodiment but is not limited thereto in other embodiments). The air outlet port 133 includes a plurality of grid bars 134. Each adjacent pair of the grid bars 134 defines an air vent 135. The fan 142 is disposed in the housing 13 proximate to the air outlet port 133.

Figure 4:
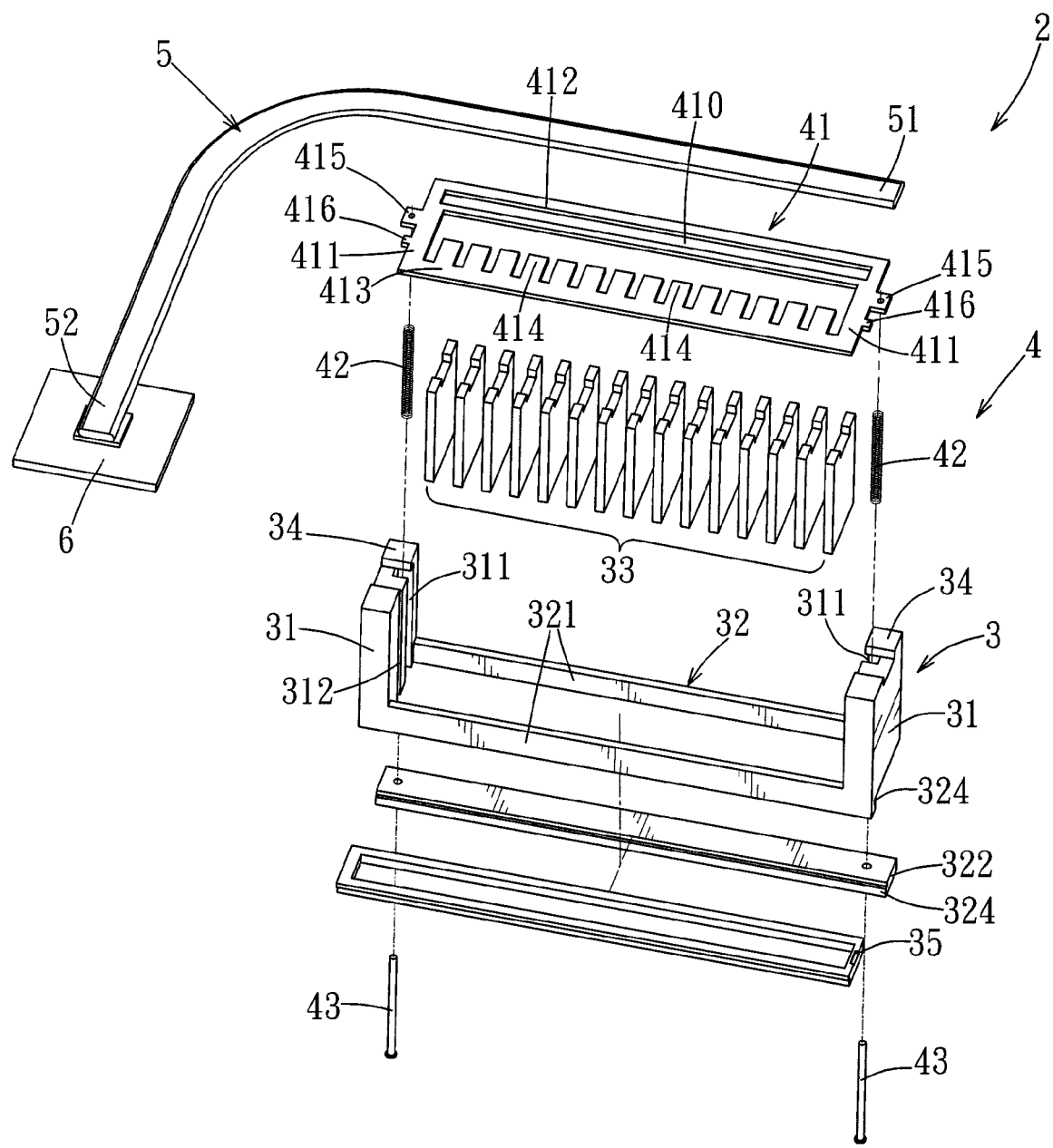
FIG. 4 is an exploded view of the heat-dissipating module of the preferred embodiment.

Referring to FIGS. 3 and 4, the heat-dissipating module 2 includes a heat-dissipating fin base 3 disposed within the housing 13 and interposed between the fan 142 and the air outlet port 133, a dust removing mechanism 4 disposed on the heat-dissipating fin base 3, a conducting heat pipe 5, and a conducting pad 6.

The heat-dissipating fin base 3 includes two upright sidewalls 31 spaced apart from each other and disposed on left and right sides thereof, a base wall 32 connected to the two upright sidewalls 31, a plurality of heat-dissipating fins 33 spaced at intervals between the two upright sidewalls 31, two stop blocks 34 formed respectively on the two upright sidewalls 31, and a dust collecting tray 35 detachably disposed on the base wall 32.

The two upright sidewalls 31 have confronting inner sides, each of which is recessed to form first and second guide grooves 311, 312 that extend longitudinally and that are spaced apart in a front-to-rear direction. The two stop blocks 34 are respectively formed on top edges of the two upright sidewalls 31, and are respectively located at top ends of the first guide grooves 311 such that the top ends of the first guide grooves 311 are partly blocked. The heat-dissipating fins 33 are arranged at spaced intervals between the two upright sidewalls 31 from left to right.

Figure 5:
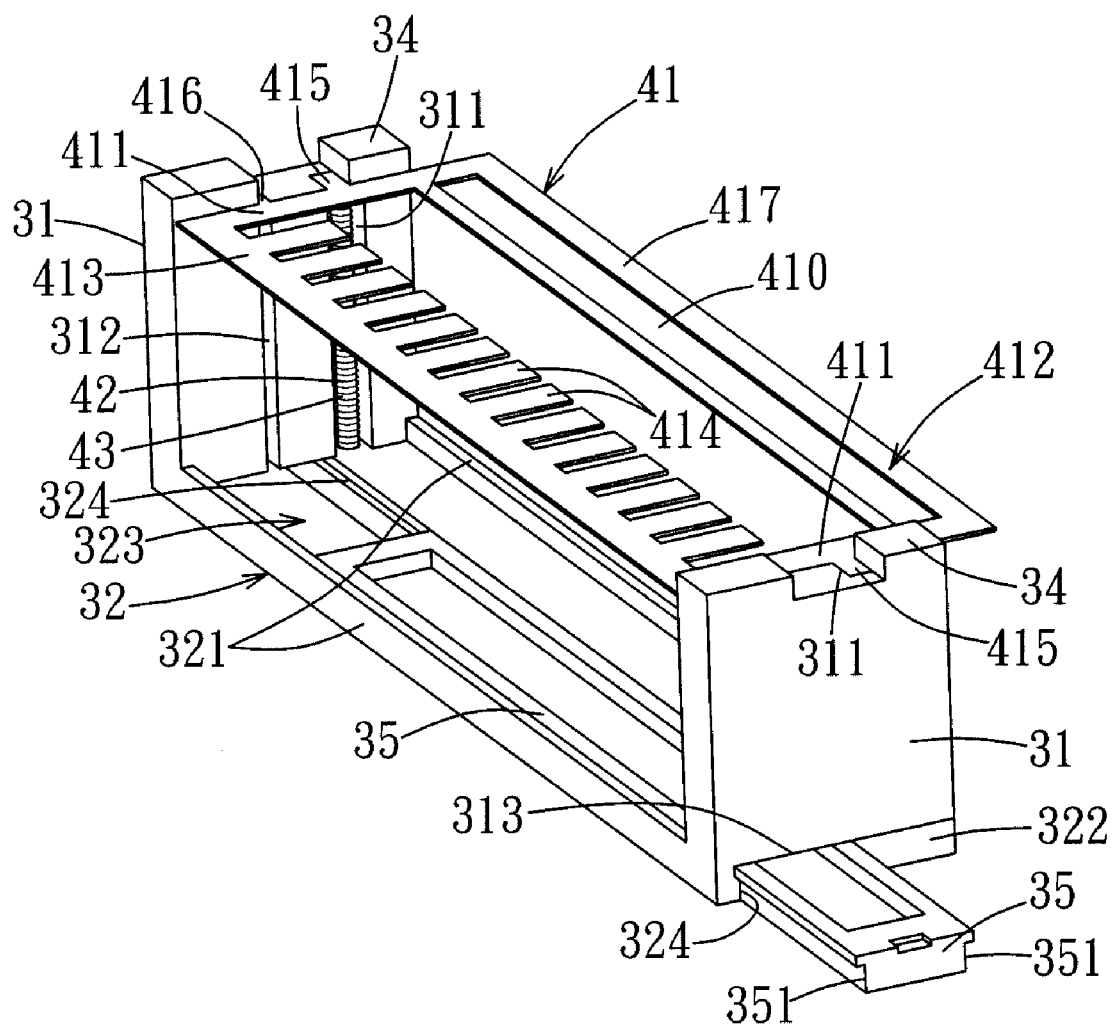
FIG. 5 is a perspective view of the heat-dissipating module of the preferred embodiment in part.

Referring to FIGS. 4 and 5, in this embodiment, the base wall 32 includes two connecting strips 321, which are spaced apart in a front-to-rear direction, and each of which is connected to outer sides of the two upright sidewalls 31, and an elongated bottom plate 322. The two upright sidewalls 31 are connected integrally via the two connecting strips 321. The bottom plate 322 is connected to and interposed between bottom edges of the two upright sidewalls 31 (the manner of connection will be described hereinafter) such that the bottom plate 322 has a plate edge spaced apart from one of the connecting strips 321. The plate edge of the bottom plate 322 and said one of the connecting strips 321 are respectively provided with first insert guide rails 324 so as to define a slide slot 323 therebetween in the base wall 32.

The dust collecting tray 35 is a substantially elongated plate with a recessed top face. The dust collecting tray 35 has two opposite lateral edges that are respectively formed with second insert guide rails 351 for engaging the first insert guide rails 324. The first and second insert guide rails 324, 351 are complementary male and female structures. Furthermore, one of the upright sidewalls 31 is provided with a first opening 313 in one end thereof at a position corresponding to the slide slot 323 so as to allow one end of the dust collecting tray 35 to be exposed therefrom. In this embodiment, the first opening 313 is defined cooperatively by the bottom edge of said one of the upright sidewalls 31 and the plate edge of the bottom plate 322 and said one of the connecting strips 321. In addition, with further reference to FIG. 3, the peripheral wall 132 of the housing 13 is provided with a second opening 136 corresponding to the first opening 313 such that, when the heat-dissipating module 2 is mounted in the housing 13, the dust collecting tray 35 can be accessed via the second opening 136 in the peripheral wall 132, and can be drawn out of the housing 13 or slid into the slide slot 323 in the base wall 32 through the peripheral wall 132 of the housing 13.

Referring to FIGS. 4 and 5, the dust removing mechanism 4 includes a scraping plate 41, two compression springs 42, and two guide rods 43.

The scraping plate 41 is substantially a frame structure, and includes two side plate portions 411, first and second plate portions 412, 413 interconnecting the two side plate portions 411, and a plurality of scraping teeth 414 disposed on the second plate portion 413 at spaced intervals.

The two side plate portions 411 are left and right opposite frame strips of the frame structure. The first and second plate portions 412, 413 are front and rear opposite frame strips of the frame structure. Each of the side plate portions 411 extends further outward to form first and second lugs 415, 416 that are spaced apart from each other in a front-to-rear relationship. The first plate portion 412 is provided with an elongate through slot 410 that extends from left to right of the frame structure. The scraping teeth 414 are disposed on an inner plate edge of the second plate portion 413 between the two side plate portions 411.

Figure 7:
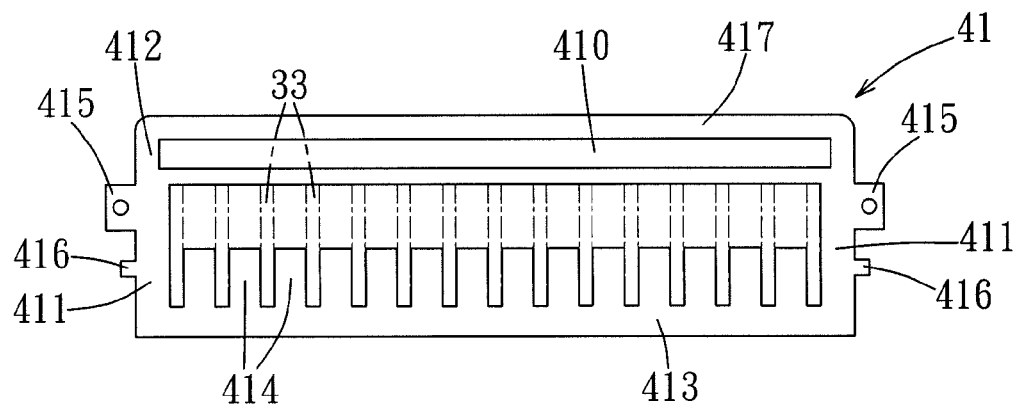
FIG. 7 is a top view of the scraping plate of the preferred embodiment.

Referring to FIGS. 4 and 5, the two guide rods 43 extend upwardly from left and right sides of the base wall 32, and are respectively disposed in the first guide grooves 311 in the two upright sidewalls 31. In this embodiment, the two guide rods 43 are pins that extend upwardly from below the base wall 32 through the bottom plate 322, the first guide grooves 311 in the two upright sidewalls 31, and the first lugs 415 of the scraping plate 41, with top ends thereof respectively abutting against lower sides of the stop blocks 34 disposed respectively on the top edges of the two upright sidewalls 31. In addition to connecting the bottom plate 322 to the bottom edges of the two upright sidewalls 31, the two guide rods 43 permit the scraping plate 41 to be coupled between the two upright sidewalls 31 of the heat-dissipating fin base 3 and to be movable upwardly and downwardly relative to the two upright sidewalls 31 and the heat-dissipating fins 33. Referring further to FIG. 7, when the scraping plate 41 is coupled to the heat-dissipating fin base 3, the scraping teeth 414 extend respectively into clearances defined among the heat-dissipating fins 33 from one side of the heat-dissipating fins 33 proximate to the fan 142 (see FIG. 2). It is noted that the length of the scraping teeth 414 extending among the heat-dissipating fins 33 is not limited to that illustrated in the accompanying drawings. The scraping teeth 414 may be configured to extend to and connect with the first plate portion 412 in other embodiments. The two first lugs 415 extend respectively into the first guide grooves 311, and the two second lugs 416 extend respectively into the second guide grooves 312.

The two compression springs 42 are respectively sleeved on the two guide rods 43, and have top ends respectively urging against lower sides of the first lugs 415 of the scraping plate 41, thereby forcing the two first lugs 415 of the scraping plate 41 to abut against the lower sides of the two stop blocks 34. Thus, the scraping plate 41 as a whole is constantly maintained above the base wall 32 in a spaced apart relationship.

Referring back to FIGS. 2 and 3, the conducting heat pipe 5 is bent and is generally L-shaped, and has first and second ends 51, 52. A portion of the conducting heat pipe 5 adjacent to the first end 51 is attached to the heat-dissipating fins 33 of the heat-dissipating fin base 3. The conducting pad 6 is connected and secured to the second end 52 of the conducting heat pipe 5. When the heat-dissipating module 2 is disposed within the housing 13 of the electronic device 1, the heat-dissipating fin base 3 is located between the air outlet port 133 of the housing 13 and the fan 142, and the conducting pad 6 is positioned above the central processing unit 141 by virtue of the length of the conducting heat pipe 5 so as to be able to come into contact with the central processing unit 141. Through the contact between the conducting pad 6 and the central processing unit 141, the heat generated by the central processing unit 141 during operation is conducted to the heat-dissipating fin base 3 through the conducting heat pipe 5. Moreover, the heat is then dispersed via the heat-dissipating fins 33 and is subsequently exhausted out of the housing 13 through the air outlet port 133 by the air current from the fan 142.

Figure 6:
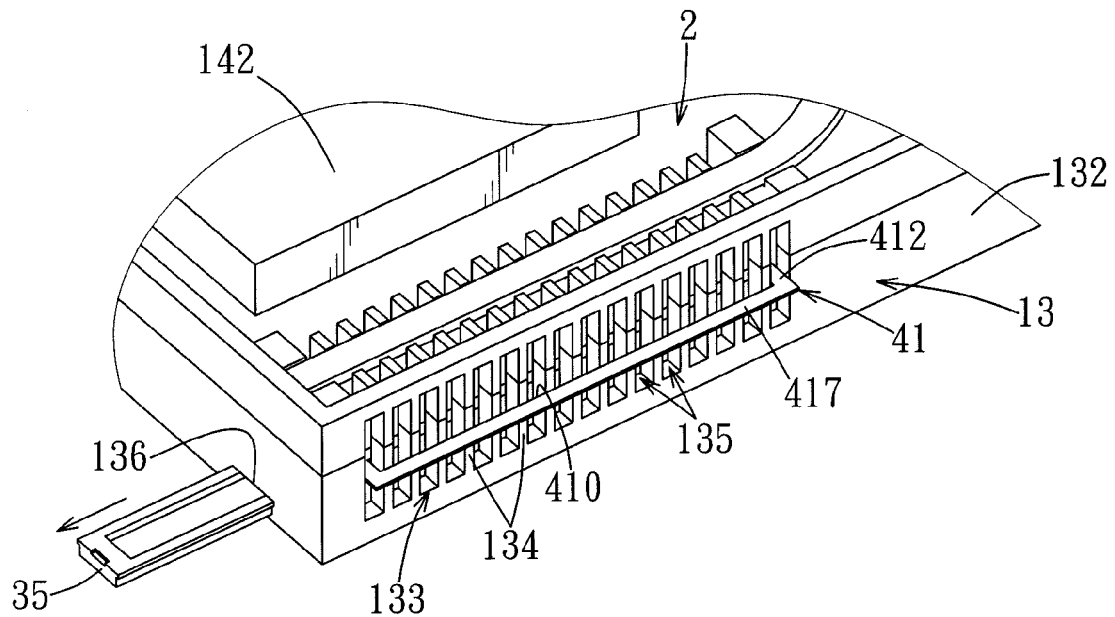
FIG. 6 is a fragmentary perspective view of the preferred embodiment, showing a scraping plate in a depressed state.

Referring to FIG. 6, after the heat-dissipating module 2 is disposed within the housing 13, the first plate portion 412 is sleeved around the grid bars 134 of the air outlet port 133 of the housing 13 with the grid bars 134 extending through the through slot 410, and with the first plate portion 412 partly projecting from the peripheral wall 132 of the housing 13 to serve as a force application portion 417.

There are various ways of enabling the force application portion 417 to project partly from the peripheral wall 132 of the housing 13. For example, the housing 13 may be configured to have complementary upper and lower housing parts, and the air outlet port 133 may include complementary upper and lower grid bars provided in upper and lower peripheral wall parts. During assembly, the heat-dissipating module 2 is first mounted on the bottom wall 131 with the first plate portion 412 sleeved around the lower grid bars, and the upper housing part is subsequently coupled to the lower housing part.

Referring to FIGS. 6 and 7, since the scraping teeth 414 of the scraping plate 41 extend into the clearances among the heat-dissipating fins 33, when it is desired to remove dust accumulated on the heat-dissipating fins 33, it is merely necessary to depress the force application portion 417 from the outside of the housing 13 so that the scraping plate 41 displaces downwardly. The scraping teeth 414 will scrape the dust and dirt adhered to the heat-dissipating fins 33 all the way down the heat-dissipating fins 33, and the scraped-off dust and dirt will be collected in the dust collecting tray 35. The dust collecting tray 35 can be slid out of the housing 13 to permit removal of the collected dust and dirt.

Due to the arrangement of the compression springs 42, when the pressure exerted on the force application portion 417 is relieved, the scraping plate 41 is restored to the initial position above the base wall 32 by the action of the compression springs 42. Thus, the scraping plate 41 is automatically restored after use to facilitate manipulation of the force application portion 417 in a next cleaning operation.

In sum, the dust removing mechanism 4 provided in the heat-dissipating module 2 of the present invention is simple in structure and easy to operate. In addition, the configuration of the scraping plate 41 permits removal of dust that accumulates among the heat-dissipating fins 33, so that the heat-dissipating fin base 3 can be maintained in a clean and ventilated state and will not be blocked by accumulated dust that affects adversely the heat dissipating effect after a period of use. Moreover, with the provision of the dust removing mechanism 4, the problem associated with poor ventilation within the electronic device 1 or possible damage to the electronic device 1 due to dust accumulation can be alleviated.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A heat-dissipating module having a dust removing mechanism, comprising:
   a heat-dissipating fin base including two upright sidewalls spaced apart from each other, a base wall connected to said two upright sidewalls, and a plurality of heat-dissipating fins arranged between said upright sidewalls at spaced intervals; and
   a dust removing mechanism including
      a scraping plate disposed movably between said two upright sidewalls, said scraping plate having a plurality of scraping teeth and a force application portion connected to said scraping teeth, said scraping teeth extending respectively into clearances among said heat-dissipating fins, said force application portion being operable to bring said scraping teeth to displace relative to said heat-dissipating fins.

2. The heat-dissipating module having a dust removing mechanism according to claim 1, wherein said dust removing mechanism further includes two guide rods extending upwardly from said base wall, said scraping plate further having two side plate portions, said scraping teeth being arranged between and connected to said two side plate portions, said side plate portions being connected to said force application portion, said two guide rods extending respectively through said two side plate portions, said scraping plate being displaceable upwardly and downwardly relative to said heat-dissipating fins along said two guide rods.

3. The heat-dissipating module having a dust removing mechanism according to claim 2, wherein said dust removing mechanism further includes two compression springs, said compression springs being sleeved respectively on said two guide rods and respectively abutting against lower sides of said two side plate portions.

4. The heat-dissipating module having a dust removing mechanism according to claim 2, wherein said scraping plate further has first and second plate portions spaced apart from each other, said first and second plate portions and said side plate portions being interconnected to form a frame structure, said first plate portion having a part serving as said force application portion, said scraping teeth being arranged on said second plate portion between said two side plate portions.

5. The heat-dissipating module having a dust removing mechanism according to claim 4, wherein said two upright sidewalls have confronting inner sides that are respectively recessed to form longitudinally extending first guide grooves, said two guide rods being disposed respectively in said first guide grooves in said two upright sidewalls, said two side plate portions respectively having first lugs projecting outwardly therefrom, said two guide rods extending respectively through said first lugs in said two side plate portions.

6. The heat-dissipating module having a dust removing mechanism according to claim 5, wherein said heat-dissipating fin base further includes two stop blocks, said stop blocks being disposed respectively on said two upright sidewalls and being located respectively at top ends of said first guide grooves, said two guide rods having top ends respectively abutting against said stop blocks.

7. The heat-dissipating module having a dust removing mechanism according to claim 6, wherein said inner sides of said two upright sidewalls are further recessed to form longitudinally extending second guide grooves, respectively, said two side plate portions respectively having second lugs projecting outwardly therefrom, said second lugs extending respectively into said second guide grooves in said two upright sidewalls.

8. The heat-dissipating module having a dust removing mechanism according to claim 1, further comprising a dust collecting tray coupled removably to said base wall, said dust collecting tray being positioned to correspond to lower sides of said scraping teeth.

9. The heat-dissipating module having a dust removing mechanism according to claim 8, wherein said base wall is provided with a slide groove, one of said upright sidewalls being provided with a first opening communicated with one end of said slide groove, said base wall being provided with a pair of first insert guide rails disposed correspondingly on two sides of said slide groove, said dust collecting tray being slidable along said slide groove and being exposed from said one of said upright sidewalls through said first opening.

10. The heat-dissipating module having a dust removing mechanism according to claim 9, wherein said base wall includes two connecting strips spaced apart from each other and connected respectively to lateral sides of said upright sidewalls, and an elongated bottom plate connected to bottom edges of said two upright sidewalls, said bottom plate having a plate edge spaced apart from one of said connecting strips, said pair of first insert guide rails being respectively provided on said plate edge of said bottom plate and said one of said connecting strips to define said slide groove.

11. The heat-dissipating module having a dust removing mechanism according to claim 10, further comprising a conducting heat pipe and a conducting pad, said conducting heat pipe having a first end connected to said heat-dissipating fin base and a second end connected to said conducting pad.

12. An assembly of an electronic device and a heat-dissipating module, said assembly comprising:
an electronic device including a housing, and an electronic component disposed within said housing, said housing being provided with an air outlet port;
a heat-dissipating module including
a heat-dissipating fin base disposed within said housing and adjacent to said air outlet port, said heat-dissipating fin base including two upright sidewalls spaced apart from each other, a base wall connected to said two upright sidewalls, and a plurality of heat-dissipating fins arranged between said upright sidewalls at spaced intervals,
a conducting pad to contact said electronic component, and
a conducting heat pipe having a first end connected to said heat-dissipating fin base, and a second end connected to said conducting pad; and
a dust removing mechanism including
a scraping plate disposed movably between said two upright sidewalls, said scraping plate having a plurality of scraping teeth and a force application portion connected to said scraping teeth and accessible outwardly of said housing, said scraping teeth extending respectively into clearances among said heat-dissipating fins, said force application portion being operable to bring said scraping teeth to displace relative to said heat-dissipating fins.

13. The assembly of an electronic device and a heat-dissipating module according to claim 12, wherein said dust removing mechanism further includes two guide rods extending upwardly from said base wall, said scraping plate further having two side plate portions, said scraping teeth being arranged between and connected to said two side plate portions, said side plate portions being connected to said force application portion, said two guide rods extending respectively through said two side plate portions, said scraping plate being displaceable upwardly and downwardly relative to said heat-dissipating fins along said two guide rods.

14. The assembly of an electronic device and a heat-dissipating module according to claim 13, wherein said dust removing mechanism further includes two compression springs, said compression springs being sleeved respectively on said two guide rods and respectively abutting against lower sides of said two side plate portions.

15. The assembly of an electronic device and a heat-dissipating module according to claim 13, wherein said scraping plate further has first and second plate portions spaced apart from each other, said first and second plate portions and said side plate portions being interconnected to form a frame structure, said first plate portion having a part extending outwardly of said housing and serving as said force application portion, said scraping teeth being arranged on said second plate portion between said two side plate portions.

16. The assembly of an electronic device and a heat-dissipating module according to claim 15, wherein said two upright sidewalls have confronting inner sides that are respectively recessed to form longitudinally extending first guide grooves, said two guide rods being disposed respectively in said first guide grooves in said two upright sidewalls, said two side plate portions respectively having first lugs projecting outwardly therefrom, said two guide rods extending respectively through said first lugs in said two side plate portions.

17. The assembly of an electronic device and a heat-dissipating module according to claim 16, wherein said heat-dissipating fin base further includes two stop blocks, said stop blocks being disposed respectively on said two upright sidewalls and being located respectively at top ends of said first guide grooves, said two guide rods having top ends respectively abutting against said stop blocks.

18. The assembly of an electronic device and a heat-dissipating module according to claim 17, wherein said inner sides of said two upright sidewalls are further recessed to form longitudinally extending second guide grooves, respectively, said two side plate portions respectively having second lugs projecting outwardly therefrom, said second lugs extending respectively into said second guide grooves in said two upright sidewalls.

19. The assembly of an electronic device and a heat-dissipating module according to claim 15, wherein said housing has a peripheral wall, said air outlet port being provided in said peripheral wall and including a plurality of grid bars spaced apart from each other, each adjacent pair of said grid bars defining an air vent, said first plate portion being provided with a through slot, said grid bars extending through said through slot.

20. The assembly of an electronic device and a heat-dissipating module according to claim 12, further comprising a dust collecting tray coupled removably to said base wall, said dust collecting tray being positioned to correspond to lower sides of said scraping teeth.

21. The assembly of an electronic device and a heat-dissipating module according to claim 20, wherein said base wall is provided with a slide groove, one of said upright sidewalls being provided with a first opening communicated with one end of said slide groove, said base wall being provided with a pair of first insert guide rails disposed correspondingly on two sides of said slide groove, said dust collecting tray being slidable along said slide groove and being exposed from said one of said upright sidewalls through said first opening.

22. The assembly of an electronic device and a heat-dissipating module according to claim 21, wherein said base wall includes two connecting strips spaced apart from each other and connected respectively to lateral sides of said upright sidewalls, and an elongated bottom plate connected to bottom edges of said two upright sidewalls, said bottom plate having a plate edge spaced apart from one of said connecting strips, said pair of first insert guide rails being respectively provided on said plate edge of said bottom plate and said one of said connecting strips to define said slide groove.

23. The assembly of an electronic device and a heat-dissipating module according to claim 12, wherein said electronic device further includes a fan disposed within said housing, said heat-dissipating fin base being interposed between said air outlet port and said fan, said scraping teeth extending into said heat-dissipating fin base from one side of said heat-dissipating fin base that is proximate to said fan.

* * * * *